(12) United States Patent
Lehane et al.

(10) Patent No.: US 11,016,123 B2
(45) Date of Patent: May 25, 2021

(54) MULTI-CHANNEL TRIGGERING APPARATUS AND METHOD

(71) Applicant: Keysight Technologies, Inc., Santa Rosa, CA (US)

(72) Inventors: Andrew Robert Lehane, Milnathort (GB); Ian Reading, Edinburgh (GB); Masaharu Goto, Hanno (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 180 days.

(21) Appl. No.: 16/169,637

(22) Filed: Oct. 24, 2018

(65) Prior Publication Data

US 2020/0132727 A1    Apr. 30, 2020

(51) Int. Cl.
*G01R 13/32* (2006.01)
*H04L 29/06* (2006.01)
*G01R 13/02* (2006.01)

(52) U.S. Cl.
CPC ......... *G01R 13/32* (2013.01); *G01R 13/0254* (2013.01); *G01R 13/0272* (2013.01); *H04L 69/12* (2013.01)

(58) Field of Classification Search
CPC ........................... G01R 13/32; G01R 13/0272; G01R 13/0254; H04L 69/12
USPC .................................................... 324/76.22
See application file for complete search history.

(56) References Cited

U.S. PATENT DOCUMENTS

| | | | |
|---|---|---|---|
| 6,892,150 B2 * | 5/2005 | Pickerd | G01R 13/0254 702/66 |
| 8,190,392 B2 | 5/2012 | Cake | |
| 9,207,263 B2 | 12/2015 | Kelly | |
| 9,268,321 B2 * | 2/2016 | Lehane | G04F 10/005 |
| 2007/0200550 A1 * | 8/2007 | Corredoura | G01R 13/0254 324/121 R |
| 2017/0031336 A1 | 2/2017 | Lehane | |
| 2018/0259562 A1 | 9/2018 | Frackelton | |

* cited by examiner

*Primary Examiner* — Farhana A Hoque

(57) ABSTRACT

An apparatus and a method for using a signal analyzer are disclosed. The apparatus includes an input port having a first plurality of input channels. The input port generates a digital data stream from each of the first plurality of input channels. The apparatus also includes a trigger bank having a second plurality of trigger processors, each trigger processor receiving a digital data stream chosen from the digital data streams and generating a trigger output having one of a plurality of possible values from the digital data stream. A trigger combiner that receives each of the trigger outputs and generates a trigger signal if the combined trigger outputs satisfy a predetermined criterion. A controller copies the digital data streams to a memory and copies the trigger processor outputs to the memory in response to the trigger combiner generating the trigger signal.

17 Claims, 3 Drawing Sheets

FIG. 1

MULTI-CHANNEL TRIGGERING APPARATUS AND METHOD

BACKGROUND OF THE INVENTION

Measurement instruments that measure, record, process a signal(s), and display the results of the processing are known to the art. For example, a digital oscilloscope measures the amplitude of a signal as a function of time and displays a portion of the observed signal as a graph of signal amplitude as a function of time. Modern digital oscilloscopes can measure a signal at a rate of close to 100 Gigasamples/sec in each of a plurality of measurement channels. The signal is typically digitized using a bank of sample and hold circuits that sample the signal in successive time slots. Each sample and hold circuit feeds a high speed analog-to-digital converter (ADC) that stores its output in a high speed memory bank that is assigned to that ADC.

Only a small fraction of this recorded data can be displayed at a time. In addition, only a fraction of the recorded data typically contains data that is of interest to the user. Hence, some form of trigger is typically used to define the beginning of the measurements of interest that are to be displayed. In many cases, the user is trying to visualize the signal in regions that satisfy some particular criterion. The criteria of interest can be complex patterns. For example, the user may wish to examine the signal in a region that follows three pulses having specified pulse widths. Hence, the trigger must be able to detect the occurrence of the three pulses.

As noted above, prior art data acquisition systems often have a plurality of channels input thereto. When analyzing a complex system, there are often a number of data streams that need to be compared. Each data stream is input to a different channel of the data acquisition device. Triggering schemes in which a trigger processor is provided for each channel, and the results of the different trigger outputs are combined in an OR circuit to generate a trigger signal that is used to signal the start of the recording of the various channels have been suggested. However, once the recordings of the waveforms have been triggered, the recordings proceed independent of subsequently obtained trigger information. Hence, the information that is displayed by an oscilloscope for the various channels is some form of average of all of the signals recorded for each channel of the oscilloscope. Such an average can hide key features of interest.

SUMMARY

The present invention includes an apparatus and a method for using a signal analyzer. The apparatus includes an input port having a first plurality of input channels. The input port generates a digital data stream from each of the first plurality of input channels. The apparatus also includes a trigger bank having a second plurality of trigger processors, each trigger processor receiving a digital data stream chosen from the digital data streams and generating a trigger output having one of a plurality of possible values from the digital data stream. A trigger combiner receives each of the trigger outputs and generates a trigger signal if the combined trigger outputs satisfy a predetermined criterion. A controller copies the digital data streams to a memory and copies the trigger processor outputs to the memory in response to the trigger combiner generating the trigger signal.

In one aspect of the invention, one of the digital data streams is input to two of the trigger processors that generate trigger signals for different predetermined criteria.

In another aspect of the invention, the controller programs at least one of the trigger processors in response to input from a user of the apparatus.

In another aspect of the invention, the trigger processor outputs are copied to the memory together with the digital data streams for a predetermined number of samples of the digital stream after the trigger combiner generates the trigger signal.

In another aspect of the invention, one of the trigger processors includes a finite state machine (FSM).

In another aspect of the invention, the FSM has more than two reporting states.

In another aspect of the invention, the trigger combiner includes an FSM that is programmed by the controller in response to input from a user of the apparatus.

In another aspect of the invention, the apparatus also includes a plurality of display buffers, one of the plurality of display buffers corresponding to each of the trigger processors.

In another aspect of the invention, the apparatus includes a display buffer corresponding to two of the trigger processors that generate a predetermined trigger output with a predetermined time of one another.

In another aspect of the invention, the controller combines the digital data stream processed by each of the trigger processors with data in the display buffer corresponding to the trigger processor that fired when the trigger combiner generates the trigger signal.

In another aspect of the invention, each of the display buffers includes an ordered sequence of memory locations indexed by an index that is determined by a sample count after the trigger combiner generates the trigger signal.

In another aspect of the invention, the display buffer includes locations corresponding to samples that were received prior to the trigger combiner generating the trigger signal.

In another aspect of the invention, each of the digital data streams includes an ordered sequence of samples and the memory includes a plurality of circular buffers, one of the plurality of circular buffers corresponding to each of the digital data streams. Each of the circular buffers is characterized by an oldest sample for each of the digital data streams, each sample of the digital data streams replacing the oldest entry in the circular buffer.

In another aspect of the invention, the controller displays the display buffers in response to user input.

In another aspect of the invention, the controller transforms the data in the display buffers and displays the transformed data.

The present invention also includes a method for operating a signal analyzer having a plurality of input channels, each input channel generating a digital data stream. The method includes providing a plurality of trigger processors, each trigger processor receiving one of the digital data streams and generating a trigger output having one of a plurality of possible values from the digital data stream, combining the trigger outputs and determining if the combined trigger outputs satisfy a predetermined criterion. The method also includes copying the digital data streams to a memory and copying the trigger processor outputs to the memory if the predetermined criterion is satisfied.

In another aspect of the invention, the method also includes providing a plurality of display buffers, one of the plurality of display buffers corresponding to each of the trigger processors, and combining the digital data stream processed by each of the trigger processors with data in the display buffer corresponding to the trigger processor that generated a predetermined trigger output when the predetermined criterion is satisfied.

DETAILED DESCRIPTION

Figure 1:
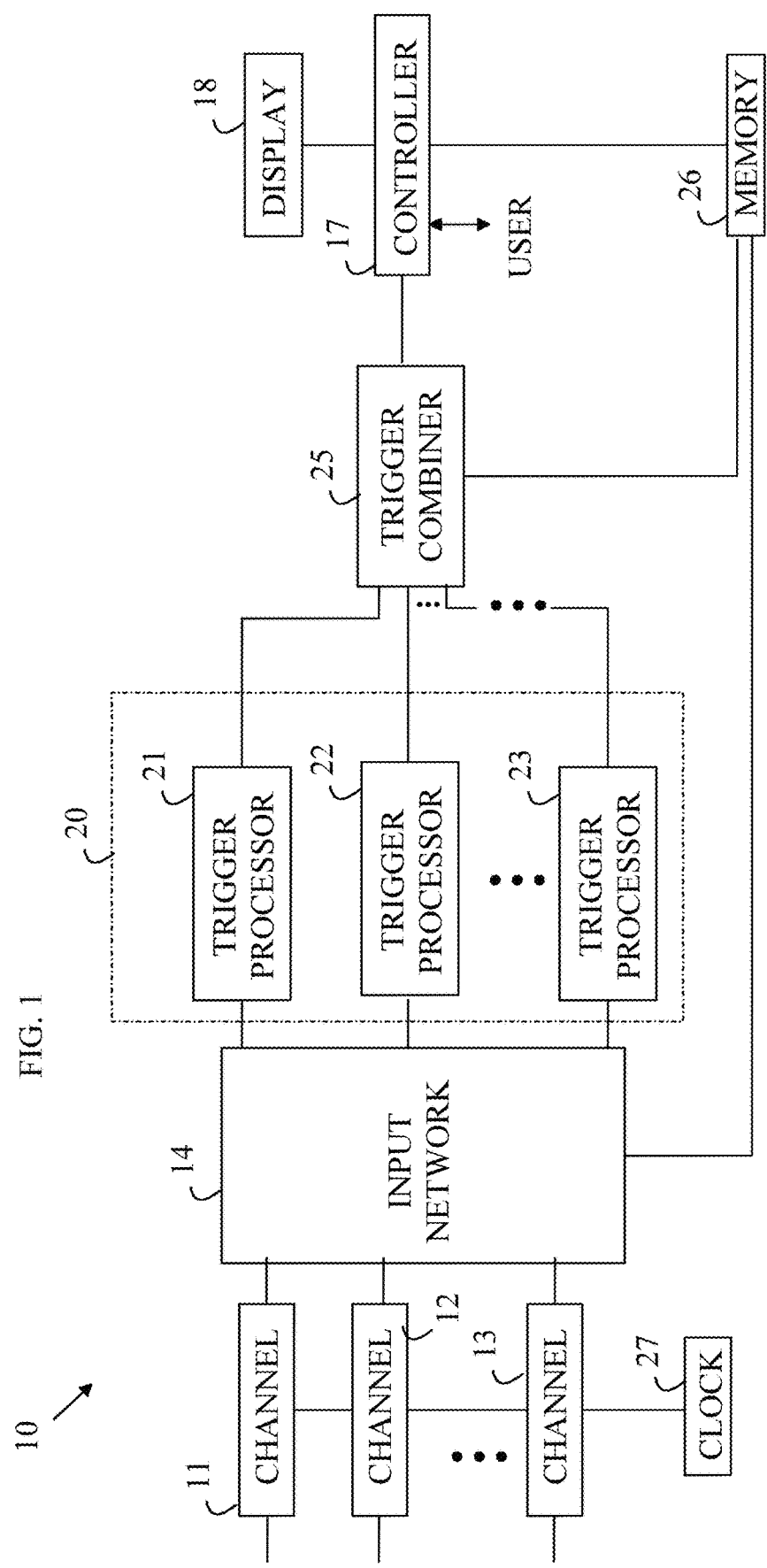
FIG. 1 illustrates an embodiment of a multi-trigger oscilloscope according to the present invention.

The manner in which the present invention provides its advantages can be more easily understood with reference to an oscilloscope with multiple input channels. In prior art systems, one or more of the channels would be input to a real time trigger (RTT) circuit. In the case of multiple channels with multiple RTTs, the results of the RTTs are input to a trigger combiner such as an OR circuit to generate a trigger signal that is used to trigger the recording of the various channels into a memory buffer. The contents of the memory buffer are then either added into a display buffer or subjected to a secondary pattern trigger to determine if the contents are to be added into the display buffer. Once the triggering of the recording has occurred, the outputs of the various RTTs are ignored until the recording has been completed.

In general, the user wishes to view an average of a large number of traces that satisfy the trigger criterion. The memory required to store all of the traces that satisfy a trigger over a large number of triggers is excessive, and hence, a smaller display buffer is set aside for each channel. When a trigger occurs, the digitized sample values for each channel are added to the corresponding locations in the buffer for that channel, and the buffer is displayed. In practice, this is accomplished by setting up a display array having a plurality of cells that are initially set to zero. Each cell is indexed such that a position in the array at index I corresponds to a sample voltage at time T+I, where T is the time of the trigger. For each trigger event, the recorded values from the channel are added into the array. The array is then displayed to the user after multiple trigger events have been observed. If the channel is the trigger channel, the display is analogous to that of a conventional single channel oscilloscope. If the circuit that generates the signals that are input to the various channels is stimulated with a repetitive signal, the displays for the other channels will also provide patterns that are helpful to the user debugging the circuit.

Consider a multi-channel trigger scheme in which a plurality of channels can generate individual trigger signals that are then combined in an OR gate to generate the trigger signal that is used to begin recording. The timing of the trigger signal relative to the signals of interest in the various channels can differ significantly depending on which channel actually generated the individual trigger signal. Consider a trigger scheme that starts recording when a "runt" is detected in either channel 1 or channel 2 of a three-channel oscilloscope. For the purposes of this discussion, a "runt" is a small peak that does not attain a height of more than some predetermined value. If the runts occur at different times in the signals, the timing of the signal features in the third channel can be significantly different even if there is a structure of interest in the third channel. Hence, the display for the third channel can contain two signals that are offset from one another by a time delay. As a result, the combined display can exhibit a complexity that is difficult to interpret.

Improvements in RTT circuitry can provide information that is useful to the user beyond merely triggering the oscilloscope. A RTT can be viewed as a feature detector that is triggered when the signal being monitored has the desired feature. In conventional triggering schemes, once the feature of interest triggers the recording of the oscilloscope, the output of the RTT during the recording is ignored. One aspect of the present invention is based on the observation that the RTT can be viewed as a signal analyzer that reports when one or more features of interest is detected in a signal that is already being recorded. This feature analysis can be useful in displaying the sub-sets of the recorded channel data and providing useful insights into the structure of the data.

Refer now to FIG. 1, which illustrates an embodiment of a multi-trigger oscilloscope according to the present invention. Oscilloscope 10 has a plurality of input channels. Exemplary input channels are shown at 11-13. Each input channel receives an analog signal and converts that signal to a digital data stream utilizing an ADC or ADCs included in the channel. Each channel has one or more ADCs depending on the speed of the oscilloscope. High speed channels that utilize a bank of ADCs to digitize an input signal at very high rates are known to the art, and hence, will not be discussed further here. It is sufficient to note that one digital value is generated on each clock cycle of clock 27 by the ADCs in each of the channels.

The digital data stream for each channel is input to an input distribution network 14 which routes the various data streams to a bank of trigger processors 20. Exemplary trigger processors are shown at 21-23. Input distribution network 14 also copies the various digital streams to a memory 26.

Each trigger processor receives one input digital data stream. Some input digital data streams may be input to more than one trigger processor, and some digital data streams may not be routed to any trigger processor. The precise distribution of the digital data streams to the trigger processors is controlled by input distribution network 14 whose connections are controlled by controller 17 in response to commands from a user. To simplify the drawing, the connections between controller 17 and input distribution network 14 have been omitted from the drawing.

Each trigger processor is a RTT processor that matches the digital data stream input thereto to a pattern. The pattern may be fixed or downloaded to that trigger processor by controller 17 in response to input from a user. Again, to simplify the drawing, the connections between controller 17 and trigger processor bank 20 have been omitted from the drawing. When a trigger processor finds a match to the pattern it is seeking, the trigger processor will be said to have fired.

In general, a trigger processor according to the present invention receives one input data stream value on each cycle of clock 27 and outputs one of a possible plurality of trigger outputs. In the simplest case, a trigger processor generates a binary output, i.e., trigger or no trigger. For example, the trigger processor could merely compare the input data stream value to a fixed threshold and fire if the input value was greater than that threshold. In another example, the trigger processor could trigger if the previous input value was less than a threshold value and the current input value is greater than that value.

A trigger processor can also be a programmable FSM. For this application, a FSM is defined to be a hardware device that can be in one of a finite number of states at any given time. The FSM receives an input in the form of a sequence of characters from a fixed first "alphabet" of characters and moves from its current state to a next state based on the received input at each step of a clock. When the FSM reaches its next state, the FSM reports the identity of that state if the state is a "reporting state". When used in the present context, the FSM reports out a "non-reporting state", if the next state is not a reporting state. Hence, the output is one of a plurality of output values from a second fixed alphabet. Trigger systems based on FSMs are known to the art. One such system is taught in U.S. Pat. No. 9,268,321, issued Feb. 23, 2016, which is hereby incorporated by reference in its entirety.

While FSMs that operate directly on a digital data stream are possible, the memory needed to implement such FSMs can be very large if the number of possible input data values is large. The memory required to implement an FSM is approximately the number of different characters in the input alphabet times the number of states. If the input alphabet is a digital value obtained by digitizing an analog signal with an ADC, the memory requirement can be significant. Hence, it is advantageous to convert the input stream to a set of symbols having fewer possible states than the input values and then define the FSM in terms of the smaller input alphabet. For example, the input data stream can be converted to a string of symbols having three or four values by assigning each symbol to a range of input values.

Any trigger pattern that can be represented by a regular expression can be implemented in a FSM. FSMs for a number of different trigger sequences are discussed in detail in the above-identified patent application, and hence, will not be discussed in detail here.

The final trigger decision is made by a trigger combiner 25 based on a program provided by controller 17. The simplest form of combiner would be an OR circuit that merely generates a trigger signal if any of the trigger processors generates a trigger signal. However, more complex trigger combiners can be utilized. For example, a trigger combiner can be set to look for a case in which one pattern trigger on channel 1 and a second pattern trigger on channel 2 fire in a predetermined sequence and within a programmed time window. In one aspect of the invention, trigger combiner 25 evaluates a logical expression defined for the various outputs to arrive at a trigger decision. For example, in the example mentioned above in which a trigger is to be generated if two of the channels have runts, trigger combiner 25 would generate a trigger if the two inputs from the channels in question were reporting symbols indicating that a runt was detected.

In more complex embodiments, trigger combiner 25 can be implemented as a FSM whose input is a multi-bit "character" that includes the outputs of the various trigger processors. For example, if each of the trigger processors generates a binary decision of trigger-no trigger, the input to trigger combiner 25 can be viewed as an N-bit word or "character" with each bit representing the output of a corresponding one of the trigger processors.

In one aspect of the invention, trigger combiner 25 also stores the outputs of the individual trigger processors at each clock cycle. The outputs of the individual trigger processors will be referred to as metadata. The metadata is also stored in memory 26. It should be noted that the trigger processors are expected to fire relatively rarely compared to the rate at which data is input to the oscilloscope. Hence, the metadata can be stored by a sequence of records that specify which trigger processor fired at a given clock cycle. Meta data can identify samples recorded because of the actions of one trigger, or if multiple triggers have fired, can identify which triggers have fired for each sample.

While in the embodiment shown in FIG. 1, the storage of the metadata is assigned to the trigger combiner, embodiments in which the individual trigger processors directly store their outputs in memory 26 can also be constructed. The manner in which this data is used during the display of the channel data stored in memory 26 will be discussed in more detail below.

When trigger combiner 25 generates a trigger signal, a predetermined number of subsequent digitized channel samples and their corresponding metadata are stored in memory 26. In one embodiment, a predetermined number of prior samples and their corresponding metadata are also stored in memory 26. In this embodiment, memory 26 is organized as a circular buffer. As each channel sample is digitized, the digitized value together with the metadata generated by the trigger processors is stored in the memory at the next available location. Since the buffer is circular, the oldest data is lost each time a new set of data values is stored. When a trigger signal is generated, this continual storage process is terminated after a predetermined number of clock cycles have elapsed. This leaves the data prior to the trigger signal that has not been overwritten in the buffer together with the predetermined number of samples after the trigger signal was generated. This arrangement allows the user to see not only the signal starting from the trigger point but also the signals just prior to the trigger point.

In one aspect of the invention, the manner in which the present invention displays the recorded data depends on the metadata recorded at the time the trigger combiner generated the trigger signal. Consider the case in which the trigger combiner is an OR circuit. The metadata for the event that triggers the oscilloscope contains the identity of the trigger processor that fired at the time of the triggering event. The specific channel that triggered the oscilloscope is also stored since the controller contains the information on which channel was connected to that trigger processor.

In a conventional oscilloscope, display 18 would contain one window for each channel. The window effectively accumulates, for example, an average of all of the signals from that channel recorded when the oscilloscope was triggered. If there is only one trigger on one channel, the displays on the other channels are expected to make "sense" if the signals in the channels are correlated with one another. In a case in which any channel can trigger the recording, even if the channels are tightly correlated, the results for a particular channel can contain the average of multiple signal types, each signal type corresponding to a different channel being triggered and being significantly different from the waveforms obtained when another channel was the source of the trigger.

The present invention overcomes this problem by providing multiple display windows for each channel, each display window corresponding to a different trigger processor providing the trigger. Since the trigger processor is connected to a specific channel, this is equivalent to providing a different display window for each combination of channel/trigger generator.

Figure 2:
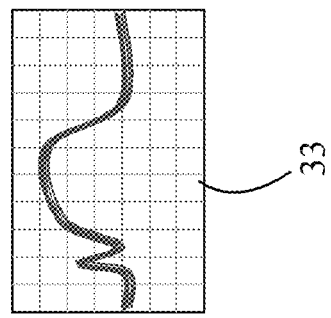
FIG. 2 illustrates three displays corresponding to channel 12 of the embodiment shown in FIG. 1 for three different triggers.
Figure 2:
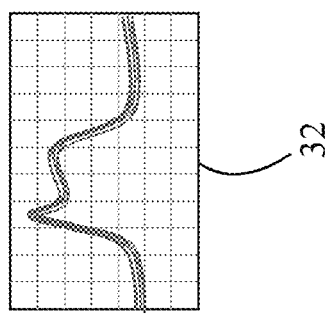
Figure 2:
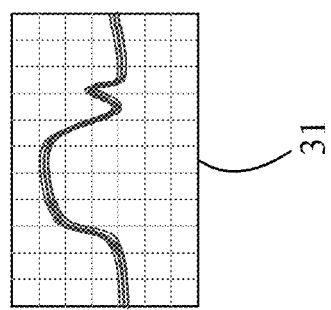

Refer now to FIG. 2, which illustrates three displays corresponding to channel 12 of the embodiment shown in FIG. 1 for three different triggers. In this example, display 31 corresponds to the channel signal when trigger processor 21 fired, display 32 to the channel 12 signal when trigger processor 22 fired, and display 33 to the channel 12 signal when trigger processor 23 fired. If the displays were not separated by trigger processors, the resulting display would be the superposition of displays 31-33, which would be far more difficult to interpret.

As noted above, in one aspect of the invention, the buffer used to store the digitized samples from the channels is a circular buffer in which each time a new set of digital channel samples arrives, the new samples replace the oldest samples in the buffer. When a trigger signal is generated by trigger combiner 25, a fixed number of further samples are stored in the buffer. The number of samples that are stored after the trigger signal is generated is less than the capacity of the buffer. Hence when storage stops after the fixed number of samples have been stored, there are still samples corresponding to channel values prior to the trigger time.

Figure 3A:
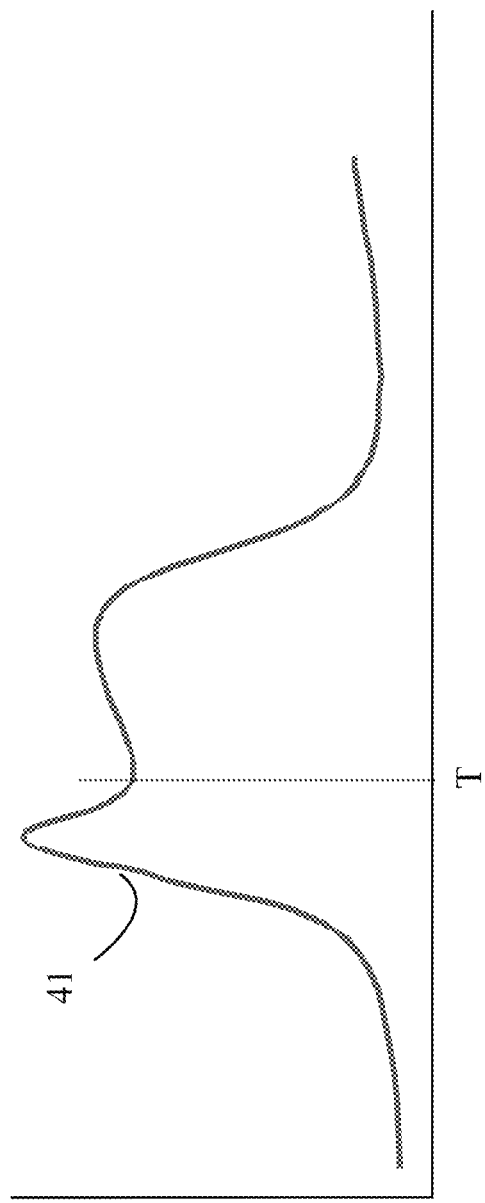
FIGS. 3A and 3B illustrate a waveform that generates a trigger at time T and the resulting stored channel samples for a system in which only the samples after the trigger point are stored.
Figure 3B:

The display buffer for the channel/trigger is updated by adding the samples prior to the trigger as well as the samples after the trigger. This allows the user to view an average waveform in one of the channels prior to the trigger point as well as the waveform after the trigger point. Refer now to FIGS. 3A and 3B, which illustrate a waveform that generates a trigger at time T and the resulting stored channel samples for a system in which only the samples after the trigger point are stored. The waveform that gave rise to the trigger is shown at 41 in FIG. 3A. For the purposes of this example, the trigger processor was configured to trigger on a positive going pulse after the pulse has reached its maximum and decreased to some predetermined level. Hence the trigger signal was generated at time T. FIG. 3B illustrates the samples from the channel that are stored in a system in which only the samples after the trigger point are stored. In contrast, in embodiments that use the circular buffer, the entire waveform shown at 41 can be viewed. In one aspect of the invention, the amount of data that is stored after trigger combiner 25 generates the trigger signal is set by controller 17 in response to input from a user.

Use of multiple trigger processors even in the case of a single channel provides significant advantages. Consider a single channel signal is routed to two trigger processors. With two processors, the oscilloscope can collect data for two different waveforms at the same time, thus reducing the dead time of the oscilloscope between waveforms that are to be recorded. The particular trigger(s) that gave rise to the trigger signal that activated the recording is stored with the metadata. Hence, data for two waveforms can be collected simultaneously, which improves the throughput of the oscilloscope.

In addition, displays can be provided for events that are characterized by multiple triggers within some time interval. Consider the simple case in which channel 1 is routed to two different trigger processors. Either trigger processor can give rise to a trigger signal. The identity of the trigger processor is stored with the metadata as described above. However the metadata continues to be stored while samples are recorded. Hence it is possible to have a trigger signal generated by trigger processor 1 starting a recording during which trigger processor 2 also fires. Since the recording is already in process, this does not give rise to a new recording session. However the fact that trigger processor 2 fired is recorded while the metadata is stored during the recording process. In one aspect of the invention, additional display windows are assigned to channel 1 to allow the waveforms associated with multiple triggers firing within the recording window.

For example, a separate display buffer can be provided for the waveform from channel 1 that is recorded when trigger processor 1 fires followed by trigger processor 2 firing within a predetermined time interval. Similarly, a separate display buffer can be provided for the waveform from channel 1 that is recorded when trigger processor 2 fires followed by trigger processor 1 firing within a predetermined time interval.

The metadata can also provide useful insight into the waveforms encountered on various channels. As noted above, the metadata continues to be recorded after a trigger has occurred. The controller can maintain separate buffers for the metadata in a manner analogous to the buffers that are maintained for displaying the signal value from the various channels. Statistical functions of the individual triggers can be useful in understanding the signal forms that are encountered in the various channels. For example, a display of the trigger frequencies as a function of the trigger can be provided. In another example, the frequency distribution of each trigger can be provided as a function of the delay time between the trigger signal from the trigger combiner and the time specific trigger fires.

While the above-described embodiments of the present invention have been directed to improvements in oscilloscopes, the present invention can also be utilized as a triggering system for other devices such as signal analyzers. In such devices, the contents of the "display buffers" discussed above can be utilized as inputs to signal processing circuitry that transforms the contents of the display buffers to obtain other information about the signals such as the spectral content of the signals stored in the display buffers. In other embodiments, the individual signals from the channels can be transformed and then added to the display buffers. An oscilloscope can be viewed as a special case of a multi-channel signal analyzer, as the processing provided by the oscilloscope averages the selected signals and displays the averaged signals. Accordingly, the term "signal analyzer" is defined to include an oscilloscope.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
    a first plurality of input channels, each of said first plurality of input channels generating a digital data stream comprising a sequence of digital values;
    a trigger bank comprising a second plurality of trigger processors, each one of said second plurality of trigger processors receiving a digital data stream chosen from said digital data streams and generating a trigger output having one of a plurality of possible values from said one of said digital data streams, one trigger processor output being generated for each digital value in said digital data stream received by said trigger processor;
    a trigger combiner that receives each of said trigger outputs and generates a trigger signal if said trigger outputs satisfy a predetermined criterion; and
    a controller that copies said digital data streams to a memory and copies said trigger processor outputs corresponding to said digital data streams to said memory in response to said trigger combiner generating said trigger signal.

2. The apparatus of claim 1 wherein one of said digital data streams is input to two of said second plurality of trigger processors that generate trigger signals for different predetermined criteria.

3. The apparatus of claim 1 wherein said controller programs at least one of said second plurality of trigger processors in response to input from a user of said apparatus.

4. The apparatus of claim 1 wherein said trigger processor outputs are copied to said memory together with said digital data streams for a predetermined number of samples of said digital streams after said trigger combiner generates said trigger signal.

5. The apparatus of claim 1 wherein one of said second plurality of trigger processors comprises a FSM.

6. The apparatus of claim 5 wherein said FSM has more than two reporting states.

7. The apparatus of claim 1 wherein said trigger combiner comprises an FSM that is programmed by said controller in response to input from a user of said apparatus.

8. The apparatus of claim 1 wherein said controller comprises a plurality of display buffers, one of said plurality of display buffers corresponding to each of said second plurality of trigger processors, each display buffer comprising a plurality of memory cells whose contents are displayed on a display.

9. The apparatus of claim 8 further comprising another display buffer corresponding to two of said second plurality of said second trigger processors generating a predetermined trigger output within a predetermined time of one another.

10. The apparatus of claim 8 wherein said controller combines said digital data stream processed by each of said second plurality of trigger processors with data in said display buffer corresponding to said one of said second plurality of trigger processors that fired when said trigger combiner generates said trigger signal.

11. The apparatus of claim 10 wherein each of said plurality of display buffers comprises an ordered sequence of memory locations indexed by an index that is determined by a sample count after said trigger combiner generates said trigger signal.

12. The apparatus of claim 10 wherein said plurality of display buffers includes locations corresponding to samples that were received prior to said trigger combiner generating said trigger signal.

13. The apparatus of claim 1 wherein each digital data steam comprises an ordered sequence of samples and said memory comprises a plurality of circular buffers, one of said plurality of circular buffers corresponding to each of said digital data streams, each of said plurality of circular buffers being characterized by an oldest sample, each sample of each of said digital data streams replacing said oldest sample in a corresponding one of said plurality of circular buffers.

14. The apparatus of claim 10 wherein said controller displays said display buffers in response to user input.

15. The apparatus of claim 10 wherein said controller transforms said data in said display buffers and displays said transformed data.

16. A method for operating a signal analyzer having a plurality of input channels, each input channel generating a digital data stream, comprising a sequence of digital values, said method comprising:
providing a plurality of trigger processors, each trigger processor receiving one of said digital data streams and generating a trigger output having one of a plurality of possible values from said digital data stream, one trigger processor output being generated for each digital value in said digital data stream received by said trigger processor;
determining if said trigger outputs satisfy a predetermined criterion; and
copying said digital data streams to a memory and copying said trigger processor outputs generated from said digital data streams to said memory if said predetermined criterion is satisfied.

17. The method of claim 16 further comprising:
providing a plurality of display buffers, one of said plurality of display buffers corresponding to each of said trigger processors; and
combining said digital data stream processed by each of said plurality of trigger processors with data in said display buffer corresponding to said trigger processor that generated a predetermined trigger output when said predetermined criterion is satisfied.

* * * * *